United States Patent [19]

Greenberg

[11] Patent Number: 5,278,872
[45] Date of Patent: Jan. 11, 1994

[54] SYSTEM AND CIRCUIT ARCHITECTURE FOR ECHO CANCELLATION AND A TELEVISION RECEIVER COMPRISING SAME

[75] Inventor: Craig B. Greenberg, Mohegan Lake, N.Y.

[73] Assignee: North American Philips Corporation, New York, N.Y.

[21] Appl. No.: 705,823

[22] Filed: May 28, 1991

[51] Int. Cl.⁵ .............................................. H04B 1/10
[52] U.S. Cl. .................................... 375/103; 375/34; 370/32.1; 379/410; 358/905; 358/167
[58] Field of Search ................. 375/103, 34; 358/167, 358/905; 379/410; 370/32.1

[56] References Cited

U.S. PATENT DOCUMENTS

| | | | |
|---|---|---|---|
| 4,582,963 | 4/1986 | Danstrom | 379/411 |
| 5,034,907 | 7/1991 | Johnson et al. | 364/724.16 |
| 5,089,892 | 2/1992 | Kopuchi et al. | 358/167 |
| 5,099,328 | 3/1992 | Kobo et al. | 358/36 |
| 5,111,298 | 5/1992 | Koo | 358/167 |
| 5,121,211 | 6/1992 | Koo | 358/905 |
| 5,161,017 | 11/1992 | Sato | 358/166 |

Primary Examiner—Curtis Kuntz
Assistant Examiner—T. Ghebretinsae
Attorney, Agent, or Firm—Michael E. Marion

[57] ABSTRACT

A circuit architecture suitable for use in a television receiver which effectively performs a ghost or echo cancellation procedure on post echo components and pre echo components occurring within the transmission channel. The apparatus features a filter circuit architecture which can be configured under programmed control so as to partition groups of its filter sections to form IIR filters and FIR filters. The filter architecture is suitable for use in multi-circuit configurations and can be used with clustering algorithms to increase the efficiency and optimize the use of the available circuit architecture.

6 Claims, 11 Drawing Sheets

SYSTEM AND CIRCUIT ARCHITECTURE FOR ECHO CANCELLATION AND A TELEVISION RECEIVER COMPRISING SAME

This application is assigned to the same assignee of U.S. Pat. No. 5,034,907 filed on Nov. 9, 1990 and U.S. Pat. No. 5,161,017, filed on Mar. 28, 1991. The contents of these applications are incorporated by reference herein.

BACKGROUND OF THE INVENTION

In 1979 the IEEE published an article which has become a basic reference in the field of television echo (or "ghost") elimination. The article is entitled "A Tutorial On Ghost Cancellation In Television Systems" and was written by Walter Ciciora, Gary Sgrignoli and William Thomas and it is incorporated by reference herein.

Although the Ciciora article described the fundamental principles, apparatus and algorithms applicable to ghost cancellation, the state of the art has only recently progressed to the point of providing practical ways to implement and improve these basic concepts.

One of the above referenced U.S. Pat. No. 5,034,907 provides an example of a signal processor architecture which can be programmed to perform varied filter and other complex digital processing operations utilizing programmed sequences of coefficients and control words. The other referenced U.S. Pat. No. 5,161,017 describes an echo cancellation apparatus which can effectively be implemented with the instant invention.

There are two main steps to the echo cancellation process. First the characteristics of the communications channel (which include the echo artifacts, if any) must be determined at the receiver. Once the channel characteristics are calculated, filters are used to implement the inverse channel to perform the echo cancellation. Because the channel characteristics may include more than one type of echo, each of which is preferably processed differently, a need exists for a circuit architecture, which among other things, provides the ability to programmably optimize a desired filter architecture for the derived channel characteristics with the speed necessary to be effective in a real time communications system. It is therefore an object of the invention, to provide a circuit architecture which lends itself to rapid filter array configuration under programmed control.

A received video signal contains echoes which are comprised of superimposed copies of the originally transmitted signal, which have different delay times and amplitudes. The strongest signal component represents the originally transmitted, or "main" signal component. Looking in the time domain, any copy component occurring before the main signal component is called a "pre-echo" component and any copy components occurring after the main signal component is called a "post-echo" component.

An IIR filter is inherently causal in nature and therefore cannot be used to cancel pre echoes. An IIR filter can, however, effectively be used to substantially cancel post-echoes.

An FIR filter, can be both causal and non-causal. The non-causality allows cancellation of pre-echoes. An FIR, filter however, cannot perform ideally unless it is of infinite length. A practical (i.e. finite length) FIR filter will therefore only suppress, but not completely cancel, the pre-echoes. The longer the FIR filter however, the better the pre-echo will be suppressed. A practical echo cancellation circuit should include therefore, an FIR filter to suppress the pre-echoes followed by an IIR filter to suppress the remaining post echoes. It is therefore another object of the invention to provide an echo cancellation circuit which includes both IIR and FIR filters for effective cancellation of both post-echoes and pre-echoes.

The bandwidth of a standard television channel, for example an NTSC channel, is about 4.2 MHz. Any digital processing therefore has to be done at a rate of 8.4 MHz. or more in order to meet the Nyquist sampling criterion. Often the processing of composite baseband NTSC signals is done at a 14.32 MHz. rate, which is four times the frequency of the color subcarrier. All echoes, for the most part, fall in a range of $-3.5$ us. to $+45$ us. with respect to the main signal component, in the time domain. For third order cancellation of pre-echoes therefore, the FIR should span about 10.5 us. and the IIR should span about 45 us. At the 14.32 MHz. sample rate for example, this would require the FIR filter to have 150 taps and the IIR filter 645 taps. These would be large and expensive filters. Fortunately, there is a tendency for the dispersed echo components to "cluster" and this property permits the design and use of filters (known as "sparse" filters) which do not require filters at every tap. Since echoes are dispersive, several taps are required to cancel them. Echoes with a phase shift in the RF domain, and echoes that do not exactly coincide with sample moments, also require multiple taps to be cancelled effectively. Taking advantage of the tendency of the dispersed echoes to cluster, each echo can be cancelled by a cluster of filter taps. Is is therefore another object of the invention to provide an architecture suitable for the implementation of sparse filters.

SUMMARY OF THE INVENTION

The instant invention comprises a circuit architecture which is suitable for use as an echo (ghost) cancellation circuit in conjunction with, or as part of, a television receiver.

One feature of the circuit architecture of the invention, is that it consists of a number of filter taps and a number of programmable delay lines which are assigned under programmed control.

Still another feature of the circuit architecture is that the taps can be clustered and positioned in time, to coincide with an echo component in order to substantially cancel it.

Another feature of the circuit architecture of the invention is that both FIR and IIR filters can be configured and a flexible FIR/IIR boundary can be configured under programmed control.

Still another feature of the circuit architecture of the invention is that the FIR/IIR boundary can be changed in real time so that the resources of the architecture are always optimally used.

Still another feature of the invention is that dual input and output busses are provided which enable the various filter sections to be assigned to either an FIR or IIR function.

Yet another feature of the circuit architecture of the invention is a common delay line.

Another feature of the circuit architecture of the invention is that it provides means for implementing a scaling algorithm in the calculation of coefficients to allow for greater bit accuracy in the filter processing.

The invention also comprises a method for selecting the coefficients for a clustered filter which is suitable for use with an embodiment of a sparse filter utilizing the circuit architecture of the invention.

These and other objects and features of the invention will be more fully appreciated from the following detailed description when taken in conjunction with the accompanying drawings, and the following detailed description of preferred embodiments of the invention.

DETAILED DESCRIPTION OF PREFERRED EMBODIMENTS OF THE INVENTION

Because of the complex environment associated with terrestrial television broadcasting, the characteristics associated with echo phenomena can consist of a main signal component, a number of pre-echo signal components and a number of post-echo signal components. Because the number and variety of echo signal components change subject to changes within the communications channel and are therefore not easily predicted, an effective echo cancellation subsystem must be adaptive in nature and must be able to periodically configure itself to meet the specific requirements of the echo pattern.

Figure 1:
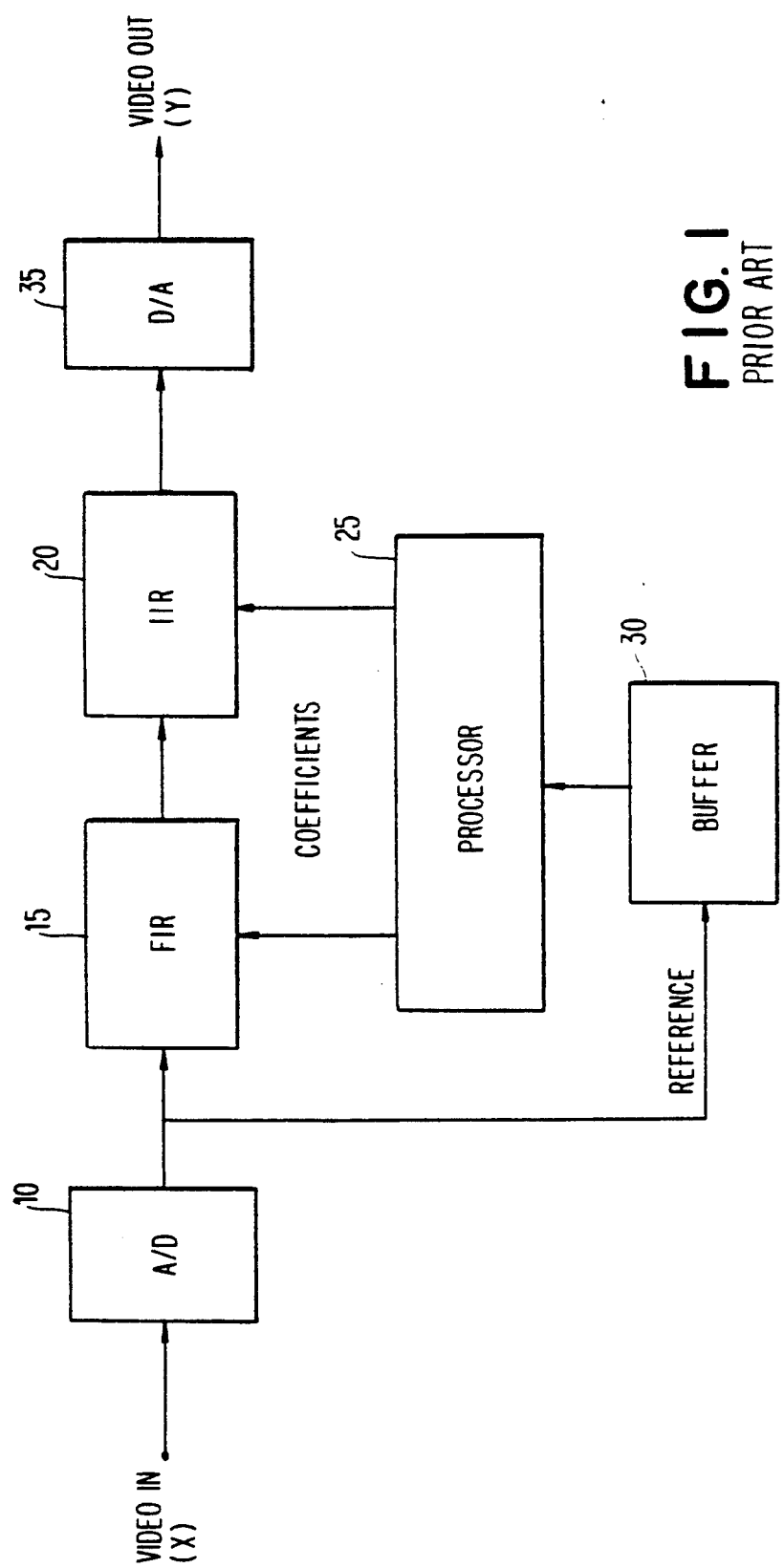
FIG. 1 is a block diagram of an echo cancellation subsystem utilizing both FIR and IIR filters.

FIG. 1 describes in block diagram form, an echo cancellation subsystem which includes both FIR and IIR filters. The FIR filter 15 is used to cancel pre-echo signal components and close post-echo components and the IIR filter 20 is used to cancel post-echo signal components. Video signals are received and digitized in A/D converter 10 and a ghost cancellation reference signal (GCR), periodically sent (during the vertical blanking interval for example), is extracted and processed by the buffer 30 and processor 25 using an algorithm designed to provide the appropriate inverse channel coefficients to filters 15 and 20. Co-pending and commonly assigned U.S. Pat. No. 5,047,859 filed Oct. 9, 1990 describes a preferred method and apparatus for calculating the appropriate coefficients and is incorporated by reference herein.

Processor 25 is also used to configure the taps of the filter circuits in order to more efficiently match the clustered nature of the echo signal phenomena.

The analysis of the channel characteristics and the calculation of the necessary filter coefficients takes place each time the apparatus comprising the invention is turned on, each time the channel being received is changed and periodically after the GCR signals from a number of fields of the video signals are received and averaged. This can be every eight fields for example. After the channel coefficients are calculated, a subset of the coefficients is chosen to reflect the clustering of the echo signals. A preferred clustering algorithm is detailed hereinbelow.

Each time the channel characteristics are analyzed, the respective numbers of pre and post-echo components are determined and the filter section resources of the filter circuit of the cancellation subsystem, in accordance with the instant invention, are optimized for maximum cancellation and efficiency by providing configuration data which adapts the subsystem architecture into the required number of FIR and IIR filters.

After the configuration data and the coefficients are determined, they are sent to the filter circuit (as described more completely below).

Figure 2:
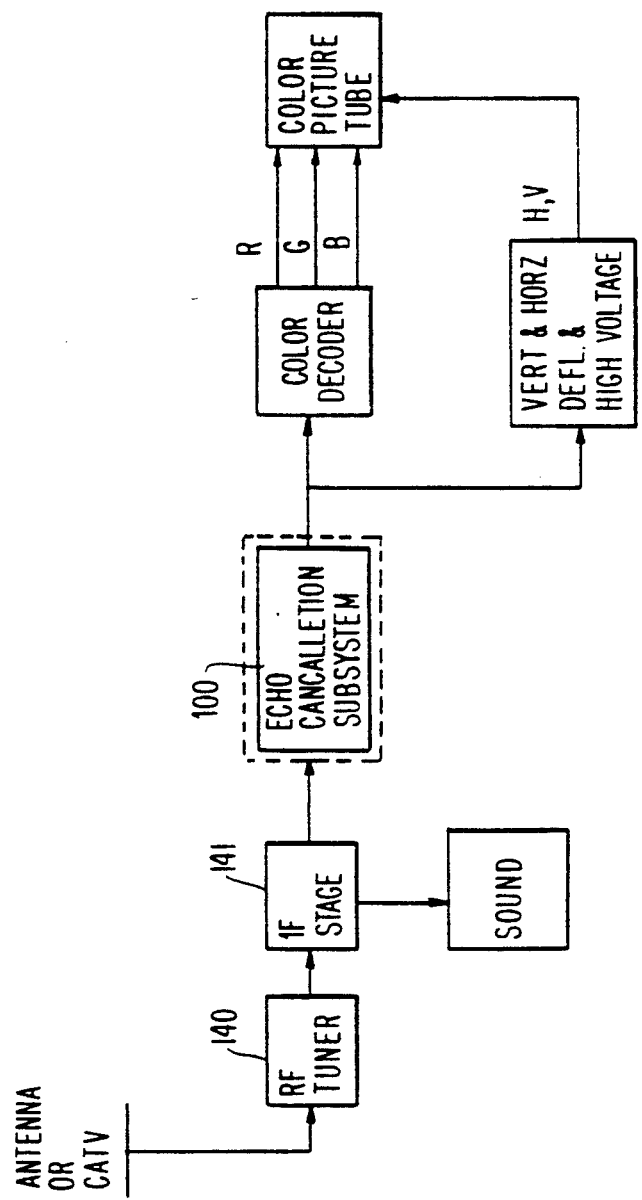
FIG. 2 is a block diagram of a color television receiver comprising an echo cancellation subsystem.
Figure 3:
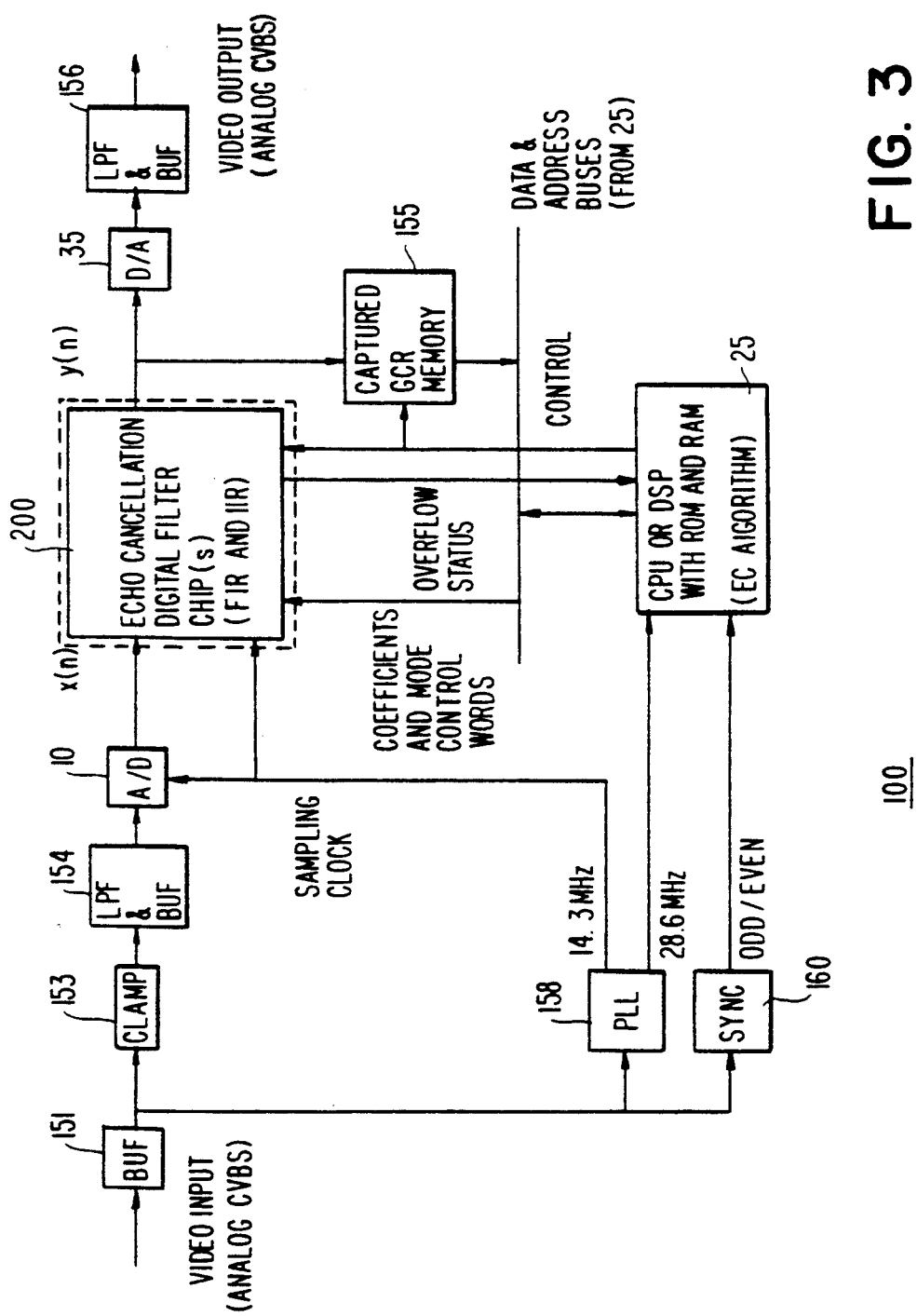
FIG. 3 is a block diagram of an embodiment of an echo cancellation subsystem comprising the invention.

FIG. 2 describes in block diagram form, a color television receiver which includes an echo cancellation subsystem 100. FIG. 3 is a block diagram of a preferred embodiment of the echo cancellation subsystem 100 shown in FIG. 2.

As described in connection with FIG. 1, a color baseband video signal including a periodic GCR signal is provided to buffer 151 from RF/IF demodulation stages 140 and 141. Sync signals from the video signal are processed in known fashion by PLL 158 to provide a sampling clock signal for A/D converter 10 which receives the clamped and low pass filtered analog video signal from clamp and LPF circuits 153 and 154. An echo cancellation filter circuit 200 having an architecture in accordance with the invention, and preferably in the form of an integrated circuit, is used to provide the FIR and IIR filter sections. Filter circuit 200 is periodically reloaded with coefficients calculated by processor 25 which can be a microprocessor or digital signal processor (DSP). The algorithms used to derived the coefficients are stored in memory which can be part of the processor 25. The processor also provides control words which configure and implement the functions of the filter circuit 200 as described in more detail below. Memory 155 is used to store the GCR during the calculation of the coefficients. Although memory 155 is shown at the output of filter circuit 200, the GCR in its unprocessed form is made available to the processor 25 by periodically bypassing the filter circuit 200. Placing the memory 155 at the filter circuit output allows the processed version of the GCR to be accessible to processor 25 as well. The output of filter circuit 200 is provided to D/A converter 35 and LPF/buffer 156.

Figure 4:
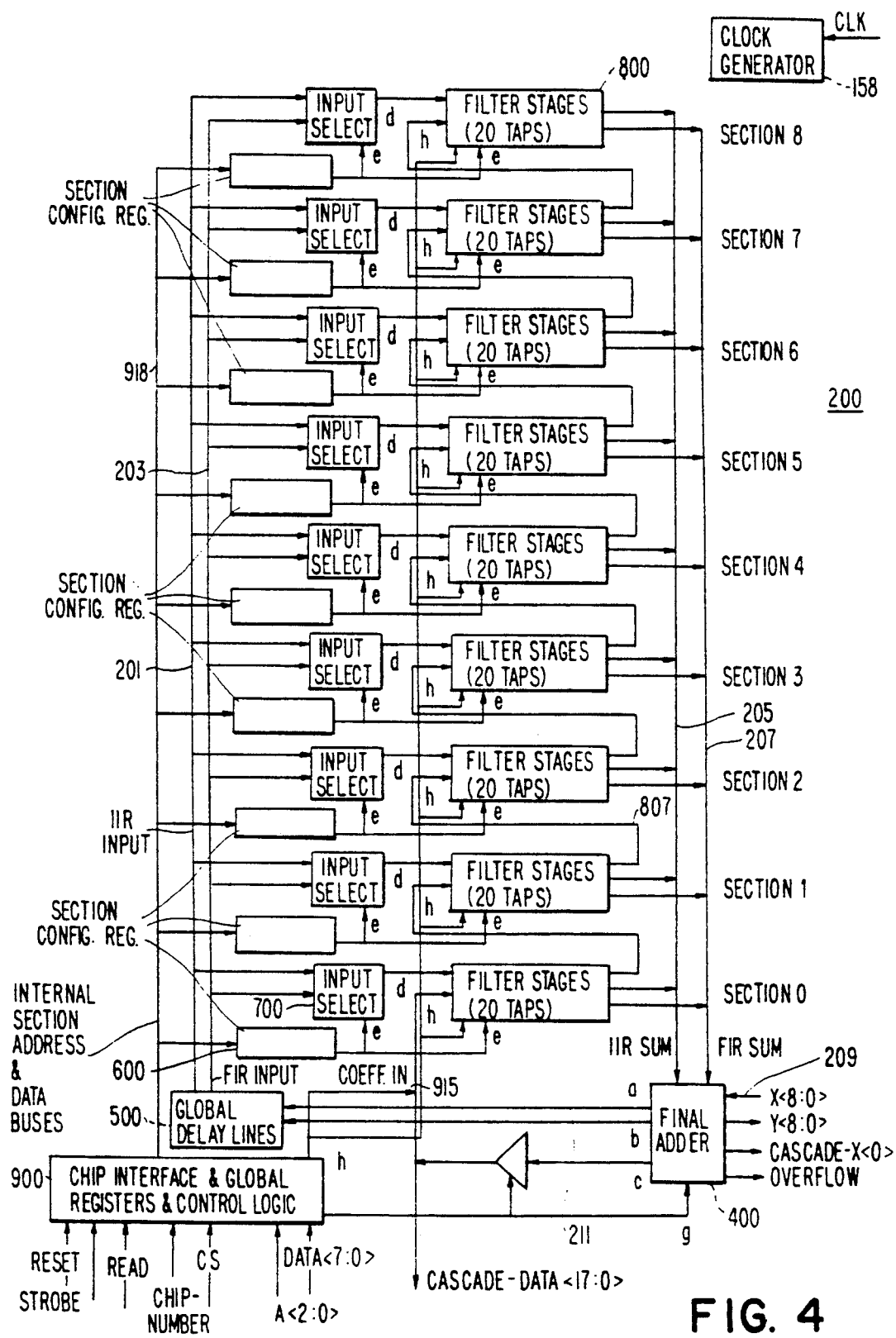
FIG. 4 is a block diagram of the circuit architecture of the echo cancellation filter shown in FIG. 3.

FIG. 4 is a detailed block diagram of the filter circuit 200 comprising an integrated circuit architecture in accordance with one embodiment of the invention. The filter circuit 200 comprises nine filter sections indicated as Sections 0-8. Each filter section comprises a section configuration register 600, an input select circuit 700 and a filter stage 800 comprising a plurality of taps (e.g. twenty). An interface circuit 900 receives data from processor 25 which includes coefficient data and configuration data, and provides control words and coefficients to the rest of the filter circuit 200. Final adder circuit 400 provides circuit input, output, summation and scaling functions for the filter circuit 200, under the control of control words provided by interface circuit 900. A global delay circuit 500 provides fixed delays for the FIR and IIR inputs as discussed in more detail below.

Filter circuit 200 operates alternatively in two modes under the control of processor 25. The first mode is the configuration mode during which configuration data and coefficients derived by processor 25 are loaded into filter circuit 200, and the second mode is the filter mode which is the normal operating mode in which echo cancellation takes place.

When a device comprising the invention, for example a television receiver, is first turned on, when the channel selector is activated, and periodically (i.e. every eight fields) during the operation of the device, the averaged GCR signal in memory 155 is processed by processor 25. Coefficients are calculated by the processor 25 together with configuration data determining, among other things, which of the filter sections will be configured to form an FIR filter and which of the filter sections will be configured to form an IIR filter. The setting of time delays for each of the filter stages 200 is also controlled by the derived control data, so as to affect the placement in time of each of the limited number of taps in order to coincide with the pre and post echo components generated by the channel disturbances. During the configuration mode, configuration data and the coefficients are loaded into the filter stages. Once this is finished, the filter circuit is switched to the filter mode.

Configuration data as well as coefficients are provided to interface circuit 900 by processor 25 on two busses; an address bus labelled A<2:0> and a data bus labelled DATA <7:0>. A number of other inputs are provided to the interface circuit 900 to provide the necessary communication with other integrated circuits in the subsystem. The purpose of these inputs are summarized as follows:

READ            Active High

The READ input specifies if the microprocessor cycle is a read or a write. This input is sampled, for example, at the rising edge of the STROBE signal.

CS
            Active High
CHIP-NUMBER

Figure 11:
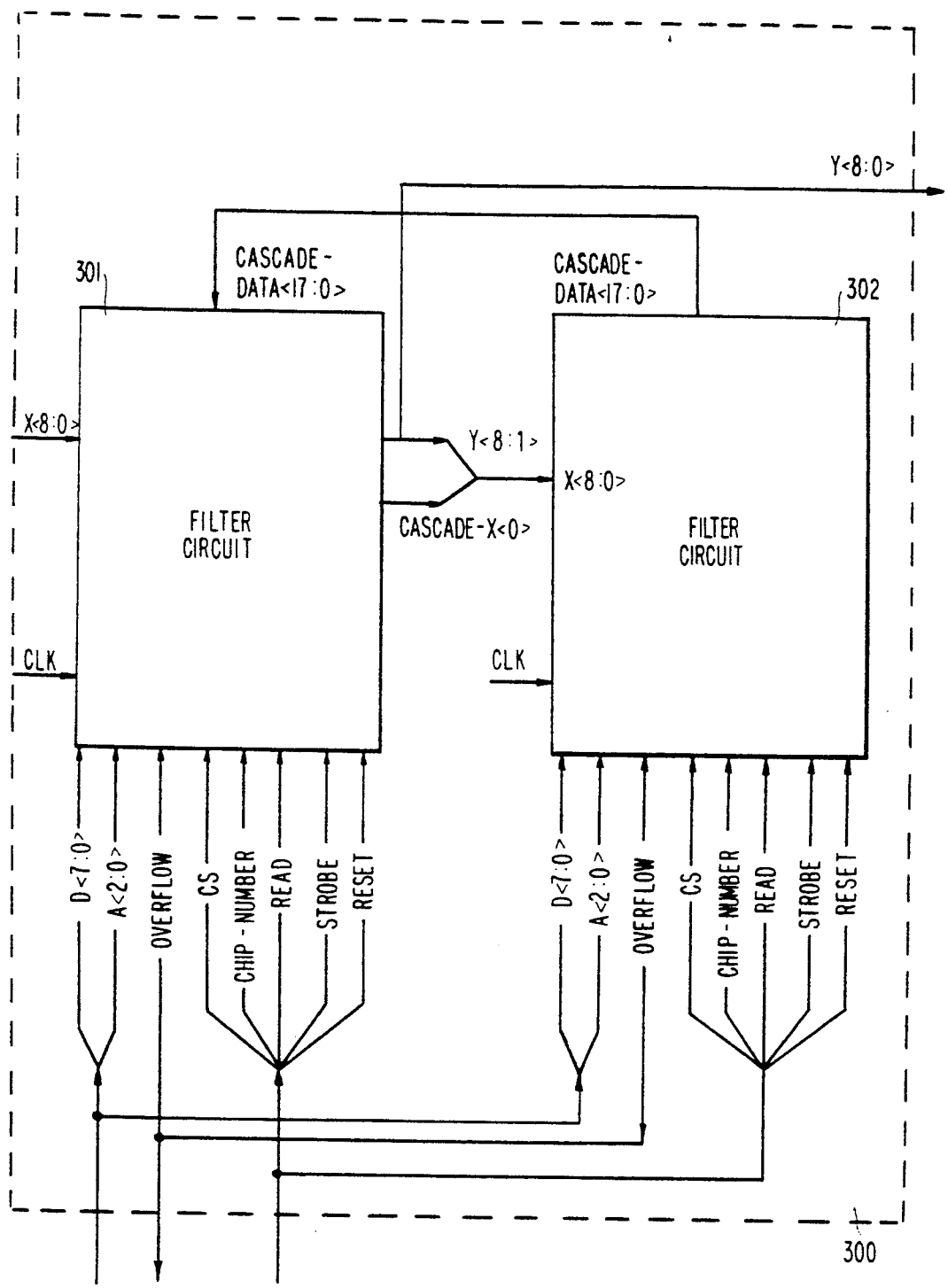
FIG. 11 is a block diagram of an embodiment of the filter circuit shown in FIG. 4 utilizing two circuit blocks.

The CS and CHIP-NUMBER inputs are used in conjunction with the signal on one bit of A<2:0> to select one filter circuit 200 in a multi-circuit configuration The CHIP-NUMBER input is used to differentiate between the main and a cascade filter circuit 200 in multi-circuit implementations, shown for example in FIG. 11. The CHIP-NUMBER input is asserted for one of the circuits and deasserted for the other. These inputs are all sampled, for example, on the rising edge of the STROBE signal. A particular filter circuit 200 is selected only if CS is asserted and A<2> is equal to the CHIP-NUMBER of the selected filter circuit. If this chip is selected, then A<1:0> specifies which internal register of interface circuit 900 is read or written to.

RESET           Active High

The RESET signal resets the internal state of the chip, and the clock generators. All filter section configuration registers 600 are reset to a known state, and the input clock generator is reset and waits for the first CLK before starting up. All microprocessor requests in progress are aborted and ignored.

STROBE          Active High

The STROBE signal clocks all the signals input to the interface circuit 900 except for RESET. The active edge of this clock is the rising edge, for example.

The configuration and operation of the filter circuit 200 will now be explained in the following example wherein three of the Sections (6–8) are configured to form an FIR filter and six of the Sections (0–5) are configured to form an IIR filter.

FILTER MODE

Figure 7:
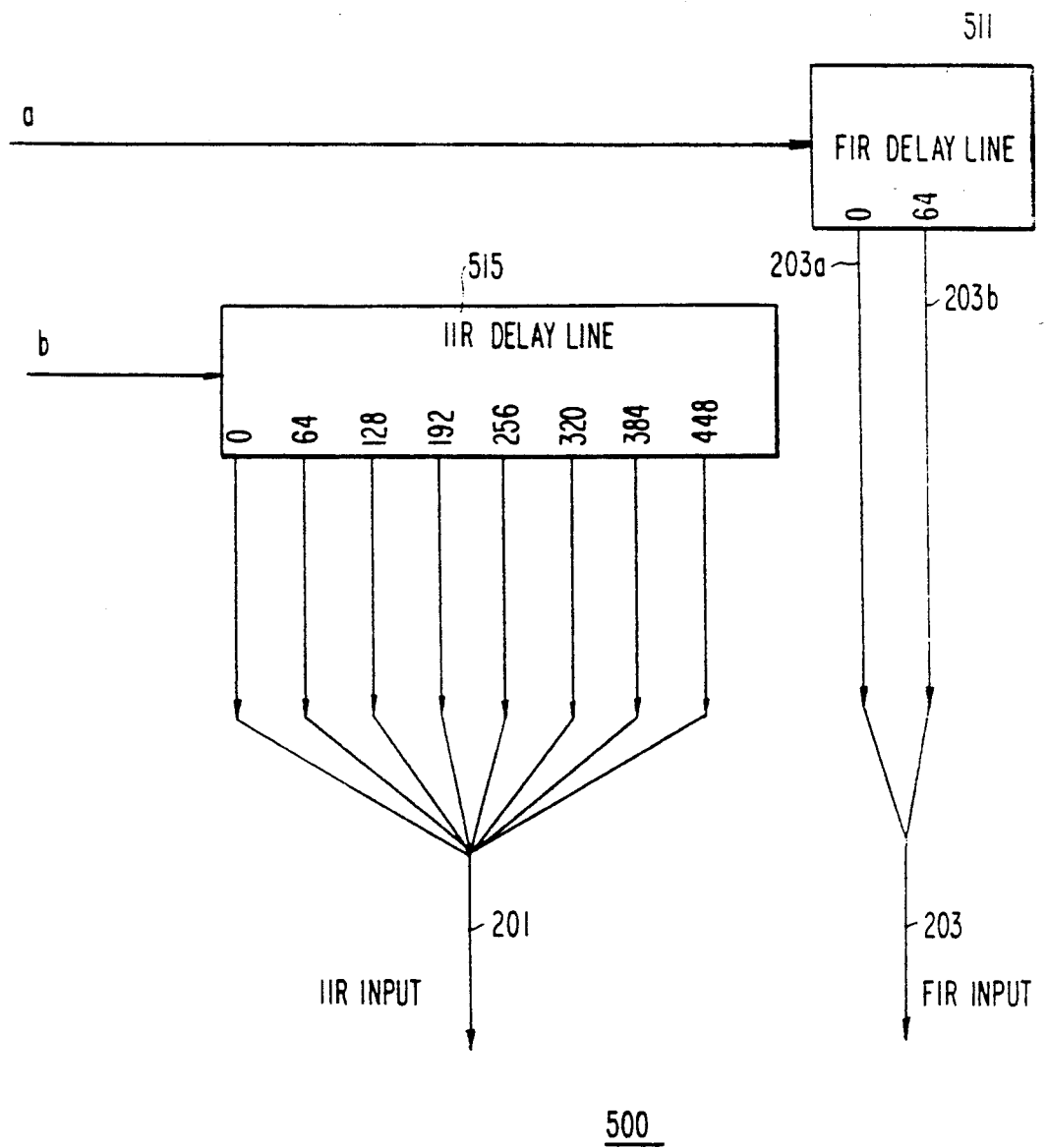
FIG. 7 is a block diagram of the global delay circuit shown in FIG. 4.

The video signal X from A/D converter 10 enters the filter circuit at the input 209 of final adder circuit 400, as a nine bit signed value. One sample is provided each sample clock time as generated by clock 158. In order to conserve chip real estate the illustrated embodiment processes video input samples as eight bit words. For greater accuracy, it can however utilize a nine-bit sample input. To do so, input signal X is rounded and its range is limited in rounding and limiting circuits 401 and 403 respectively, so as to convert its nine bit signed value to an eight bit signed value. The eight bit value is then provided at output 211 and designated as a. Signal a is fed to global delay line 500 shown in more detail in FIG. 7.

FIR delay line 511 processes signal a and provides two outputs, one being signal a with no delay, and one being a delayed version of signal a having a fixed delay of 64 sample times. The zero delay output appears on the first eight bits (203a) of bus 203 and the delayed output appears on the last eight bits (203b) of bus 203.

Figure 8:
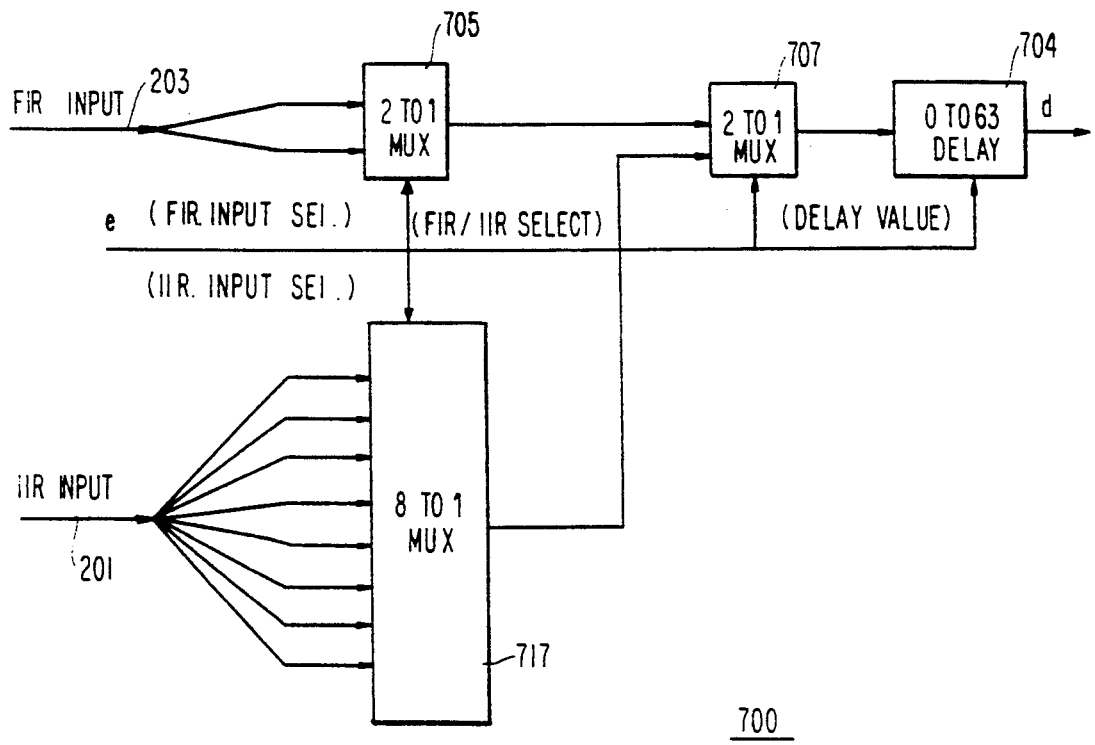
FIG. 8 is a block diagram of the a select circuit shown in FIG. 4.

As shown in FIG. 8, the delayed and non-delayed FIR input signals are provided to multiplexer 705 of input select circuit 700. As discussed in more detail below, control word e comprises twelve control bits provided by the interface circuit 900, to each section configuration register 600. One control bit of control word e selects one of the two FIR input signals to multiplexer 705 to provide either a delayed or an undelayed signal a to a first input of multiplexer 707. The second input to multiplexer 707 is the IIR signal output (as discussed in more detail below).

Each input select circuit 700 provides an input signal d to its respective filter stage 800. Signal d is a delayed version of the output of multiplexer 707 which is selected by another control bit of control word e. The output of multiplexer 707 is coupled to local delay line 704 which provides an additional delay of from zero to 63 samples, selected by six control bits of control word e. Signal d therefore is the sample X which has been rounded and limited and provided with a total amount of delay determined by the fixed delay provided by global delay line 500 and a programmable delay provided by delay line 704. The effective delay for each of the filter sections 6, 7 and 8 may be different.

Figure 9:
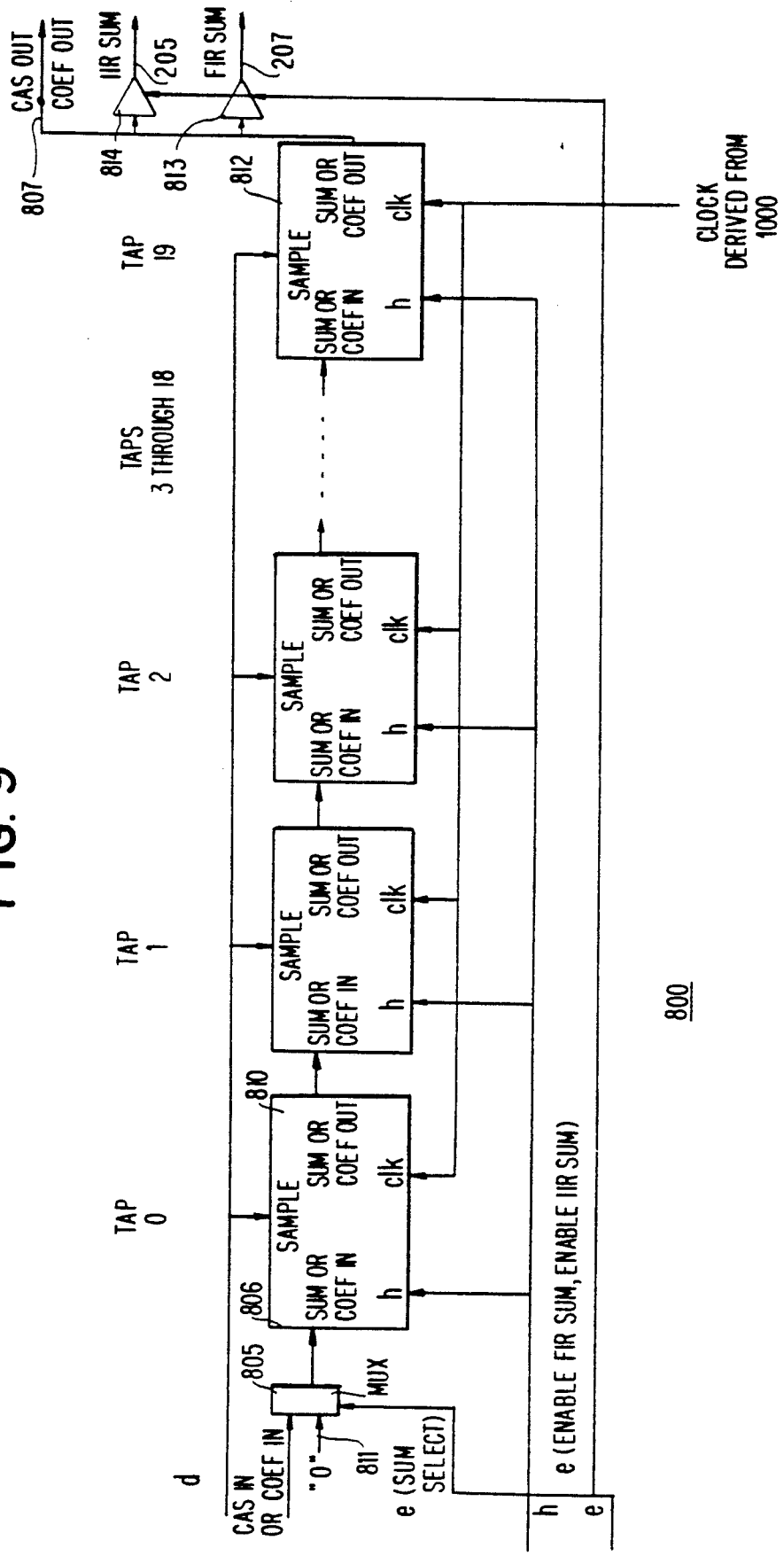
FIG. 9 is a block diagram of a filter stage shown in FIG. 4.

As stated above, the instant invention can be configured to perform both FIR and IIR filter functions. The boundary between the respective groups of filter sections, i.e. between section 5 and section 6 in the instant example is set by choosing a zero value as an input 806 ("sum in or coef in") to the first filter stage 810 (tap 0)

of filter section 6 as shown in FIG. 9. Multiplexer 805 has two inputs. The first input, labelled "cas in or coef in", is either a coefficient provided during the configuration load mode or the cascade output 807 (cas out) from the preceding filter section. The second input to multiplexer 805 is a zero value. The output of multiplexer 805 is selected by another control bit of control word e.

In the instant example, the output of filter section 6 provided at its respective output (labelled "cas out coef out") is coupled to "cas in coef in" of section 7 and the "cas out coef out" of filter section 7 is coupled to the "cas in coef in" of section 8.

The output of filter section 8, "sum or coef out" 812, is provided to "cas out coef out" 807 and to gates 813 and 814. Gate 813, when enabled by another control bit of control word e, passes the output to the FIR Sum bus 207. Sections 6, 7 and 8 thus form a continuous FIR filter with a total of 60 taps (20 each from sections 6, 7 and 8).

FIR Sum bus 207 is coupled to scaler 407 of final adder 400. During the sampling of the video signal, known scaling techniques can be used to increase the effective bit accuracy of the coefficients. Scaler 407, under the control of control word g, provides a compensating factor (as described in more detail below) to restore each sample to its proper level. Scaler 420 performs the same function on the IIR sum bus signal under the control of control word g.

The scaler 407 can be simple barrel shifter which functions as a multiplier. Its setting depends on the level of actual coefficients. The output of scaler 407 can then be added to a scaled version of the signal provided by the IIR Sum bus 205 and the output of unity gain delay 405, in summer 408. The output of summer 408 is then rounded off and limited in circuits 409 and 410 respectively and provided as one input to multiplexer 415 which provides the nine bit output of filter circuit 200, Y<8:0>. If in rounding out the signal the result is out of range this condition will be indicated by asserting a chip signal OVERFLOW flag.

Filter sections 0 through 5 are configured to form an IIR filter. The output signal from summer 408 is rounded off and limited in circuits 421 and 422 to form signal b which is coupled to IIR delay line 515 of global delay circuit 500. Signal b, as provided by summer 408, provides the feedback loop necessary for an IIR filter.

Delay line 515 provides eight fixed delay versions of signal b on bus 201, each having a different delay time from 0 to 448 samples. Bus 201 which provides the IIR input, is coupled to multiplexer 717 of each input select circuit 700.

In the instant example, sections 0 through 5 are arranged as an IIR filter. This, in effect, causes a clustering of the taps wherein the separation of the clusters will be determined by the difference in the effective delay values. The choice of delay is made by multiplexer 717 under the control of three control bits of control word e.

As in the case for the FIR filter sections, the first of the IIR sections, i.e. filter section 0, must have a zero value as an input 806 ("sum or coef in") to its first filter stage 810 (tap 0). As described above with respect to filter section 6 of the FIR filter, multiplexer 805 selects either the "cas in or coef in" input or a zero value, as the "sum or coef in" input to filter stage 810 of filter section 0, in response to a control bit of control word e. The "sum or coef out" 812 of filter section 5 is coupled to "cas out coef out" 807 and to gates 813 and 814. Gate 814, when enabled by another control bit of control word e, passes the output of filter section 5 to the IIR sum bus 205. The "sum or coef out" output of filter section 0 feeds the "sum or coef in" input of filter section 1 and so on in order to form, in this example, an IIR filter with 120 taps.

The IIR sum bus 205 is coupled to scaler 420 of the final adder 400 where it is scaled and added to the output of the FIR scaler 407 and the output of unity gain delay 405 in summer 408.

An input unity gain delay 405 consists of a delay which enables the setting of a position of a coefficient of value one. This position is considered the so-called unity gain tap in the FIR. The unity gain tap allows the use of a large scaler factor at the output of the FIR sum bus by removing the only large coefficient in the FIR filter. Multiplexer 415, under the control of a control bit of control word g, can be used to output an unprocessed but delayed version of the input video signal from input unity gain delay 405.

CONFIGURATION MODE

Figure 6:
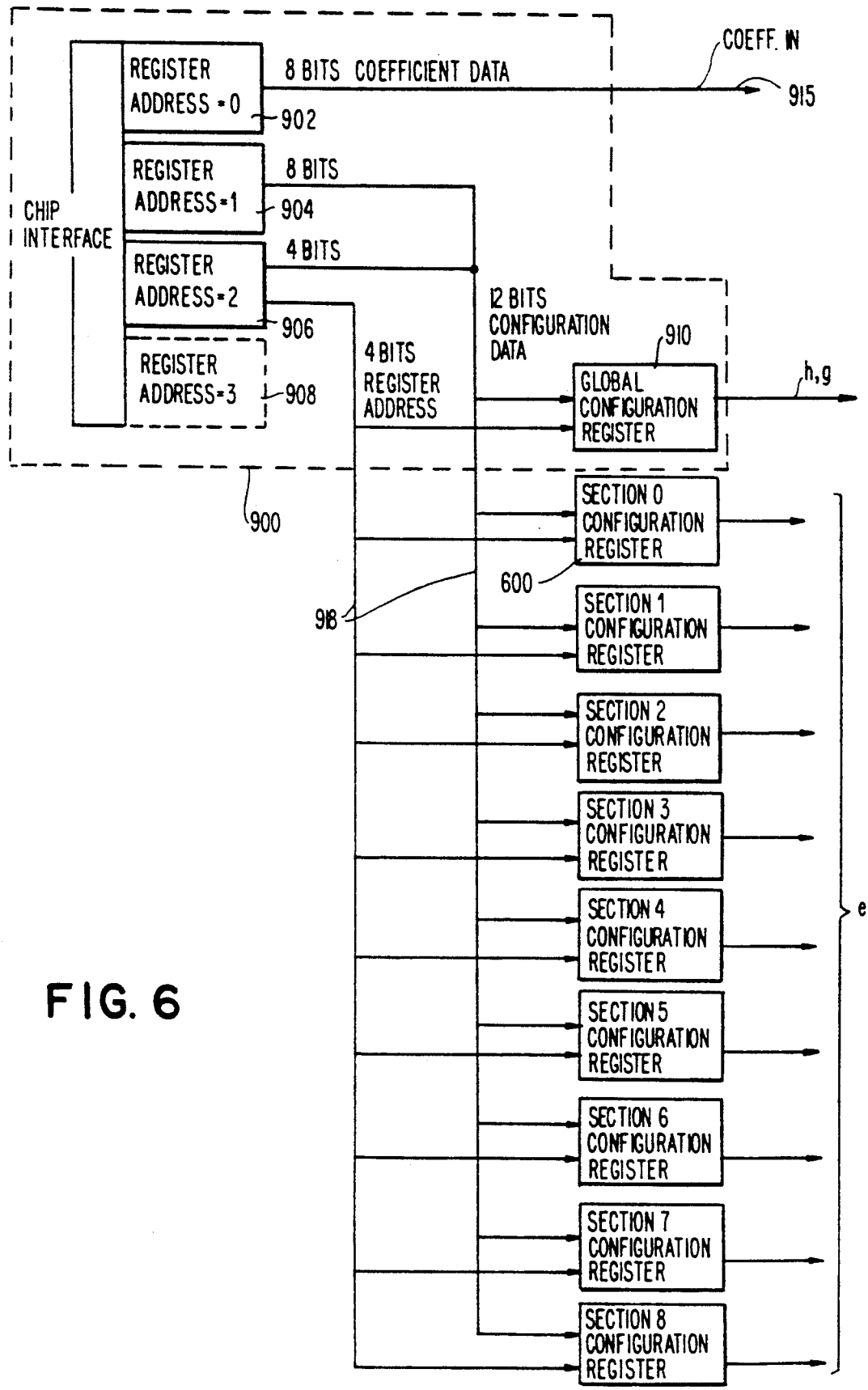
FIG. 6 is a block diagram of the interface and global register circuit shown in FIG. 4.

As described above, interface circuit 900 provides configuration data to each section configuration register 600 on bus 918 as well as to the final adder 400. It also provides coefficient data to each of the filter stages 800 on bus 915. FIG. 6 shows a more detailed version of interface circuit 900 consisting of a plurality of registers providing 8 bits of coefficient data, 12 bits of configuration data and 4 bits of address data.

As viewed by a programmer, there are two levels of registers in the filter circuit 200. The first level consists of three registers 902, 904 and 906 which have respectively register addresses 0, 1 and 2. A fourth register 908 is also provided in the illustrated embodiment but is, at present, unused. The address provided at the A<2:0> port of interface circuit 900 determines which of these registers the data provided on the data port DATA <7:0> are written into. In a multi-circuit system such as the one illustrated in FIG. 11, one bit (A<2>) selects the filter circuit 200, and the remaining bits (A<1:0>) selects the register (902, 904, 906 or 908).

The second level of registers in filter circuit 200 comprises:

(a) a first group of registers comprising each register 815 present in each of the taps 810 in each of the filter sections. Each register 815 actually comprises a plurality of holding registers (for example 180) for storing coefficients to be loaded into each tap (as explained in greater detail below);

(b) a single global register 910 which is part of the interface circuit 900, which stores the configuration data forming control words h and g; and (c) a second group of registers comprising the nine section configuration registers 600, one for each filter section, which store the configuration data forming control word e.

Table I describes the addressing and bit assignment for registers 902 through 908. The registers 902 through 908 each store eight bits of data.

TABLE I

| Address A<1:0> | Name | Bits | Usage of bits |
|---|---|---|---|
| 0 | COEFFICIENT | <7:0> | signed coefficient values |
| 1 | CONFIGURA-TION-LOW | <7:0> | low 8 bits of 12 bit configuration data |

TABLE I-continued

| Address A<1:0> | Name | Bits | Usage of bits |
|---|---|---|---|
| 2 | CONFIGURA-TION-HIGH GLOBAL/CONFIGURATION REGISTER ADDRESS | <3:0><br><7:4> | top 4 bits of 12 bit configuration data<br>internal address for selecting global or configuration register (see Table II) |
| 3 | TEST | | Miscellaneous use |

Register 902 holds eight bits of coefficient data provided to each of the filter stages 800 as "coef in" on bus 915. Coefficient data is made available to interface circuit 900 at its DATA<7:0> port, from processor 25. The address provided at A<2:0> by the processor 25, selects register 902 as the destination for the coefficient data. Configuration data is provided to eight bit registers 904 and register 906 from processor 25 through the DATA<7:0> port. Register 904 holds eight bits of configuration data and register 906 holds four bits of configuration data and an additional four address bits to select which of the second group of section coefficient registers 600 or the global register 910 receives the twelve bits of configuration data as described in Table II.

TABLE II

| <7:4> | Selected Configuration Register |
|---|---|
| 0 | Filter section 0 configuration register |
| 1 | Filter section 1 configuration register |
| 2 | Filter section 2 configuration register |
| 3 | Filter section 3 configuration register |
| 4 | Filter section 4 configuration register |
| 5 | Filter section 5 configuration register |
| 6 | Filter section 6 configuration register |
| 7 | Filter section 7 configuration register |
| 8 | Filter section 8 configuration register |
| 9 | miscellaneous |
| 10 | miscellaneous |
| 11 | miscellaneous |
| 12 | miscellaneous |
| 13 | miscellaneous |
| 14 | Global configuration register |
| 15 | All (0 to 8) section configuration registers |

The global register 910, provides control words g and h. Control word g provides the control bits to configure the final adder 400. Control word h, comprising the "md" and "ld-coef" signals, is provided to each of the filter taps 810 (as described below). Control words g and h control the filter circuit functions as described in Table III below.

TABLE III

Figure 5:
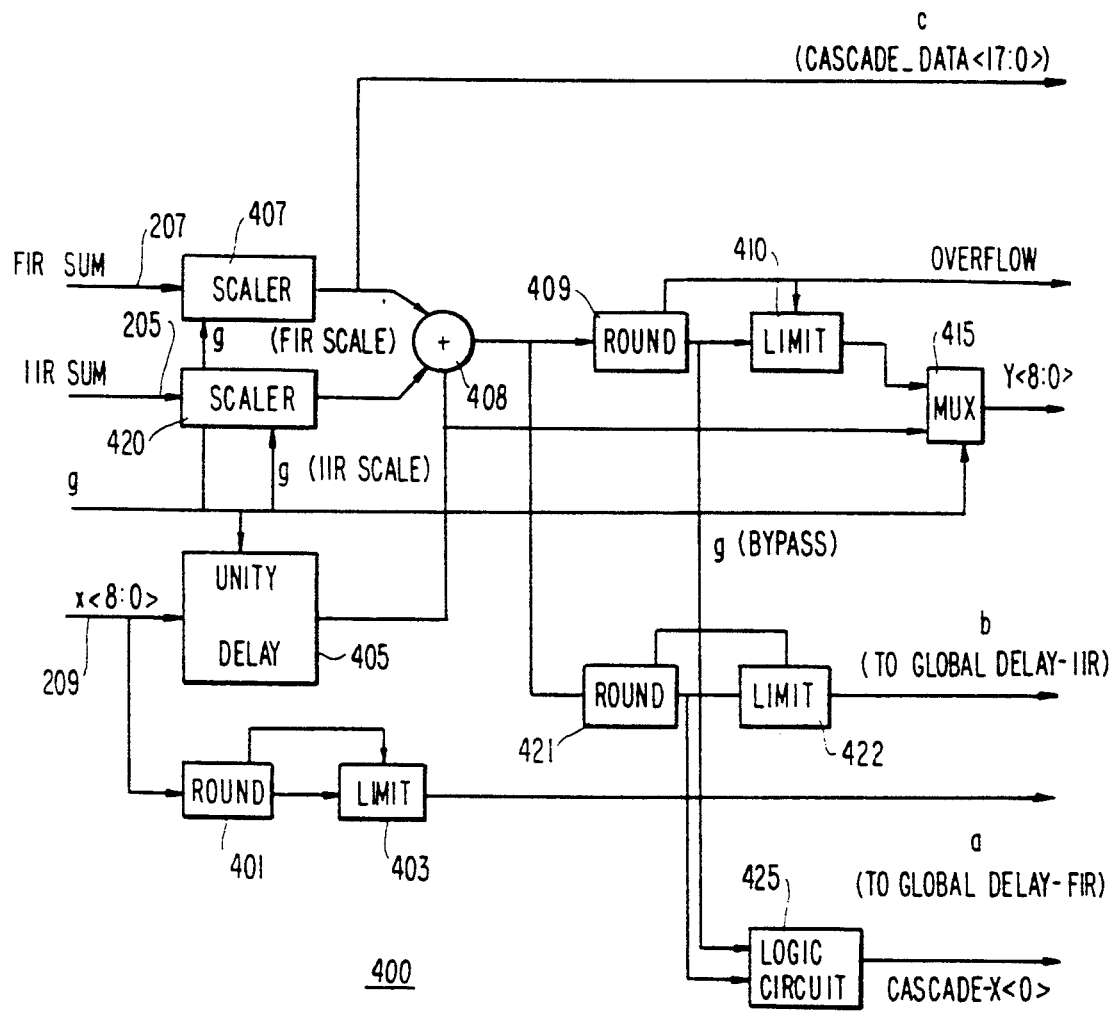
FIG. 5 is a block diagram of the final adder circuit shown in FIG. 4.
Figure 10:
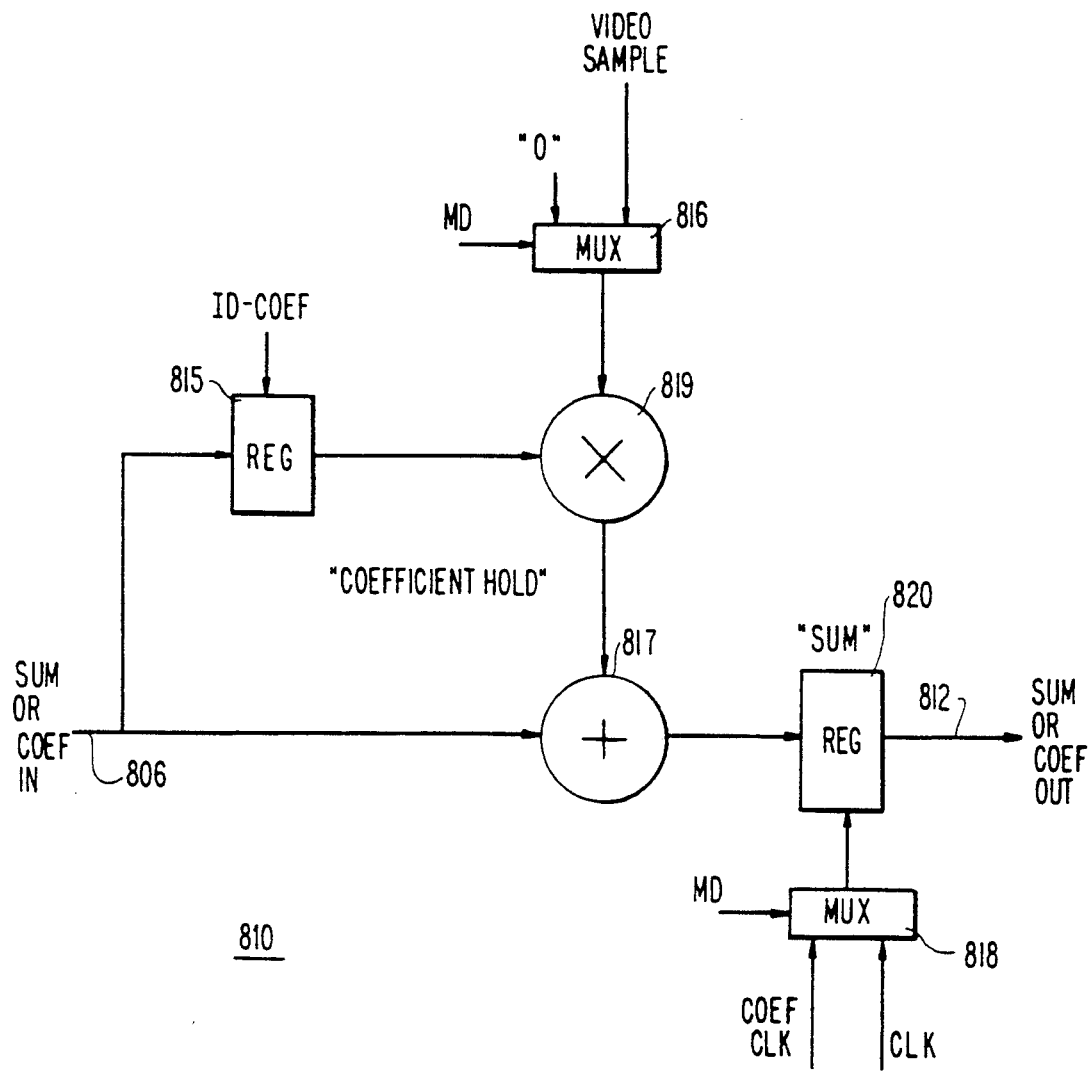
FIG. 10 is a block diagram of one of the taps of the filter stage shown in FIG. 9.

| Bit | Usage | Control Word |
|---|---|---|
| <2:0> | FIR scale factor (1/1 to 1/16) | FIG. 5-g (FIR scale) |
| <5:3> | IIR scale factor (1/1 to 1/16) | FIG. 5-g (IIR scale) |
| <6> | Select bypassed output | FIG. 5-g (bypass) |
| <7> | 8-bit filter enable | |
| <8> | signed samples | |
| <9> | Load coefficient mode | FIG. 10-md  } h |
| <10> | Load coefficient strobe | FIG. 10-ld-coef } h |
| <11> | miscellaneous | |

Each of the configuration registers 600 provides a separate control word e to its respective filter section 800 thereby setting the mode of operation and value of parameters that are local to each of the filter sections as shown in Table IV.

TABLE IV

| Bit | Usage | Control Word e |
|---|---|---|
| <5:0> | Input delay value (0-63 samples) | FIG. 8 (delay value) |
| <6> | FIR - select global delay source | FIG. 8 (fir input sel.) |
| <8:6> | IIR - select global delay source | FIG. 8 (iir input sel.) |
| <9> | FIR Enable | FIG. 8 (fir/iir select) |
| <10> | Output Enable | FIG. 9 (enable fir sum)<br>FIG. 9 (enable iir sum) |
| <11> | Enable cascade | FIG. 9 (sum select) |

The configuration mode of the filter circuit 200 is activated when a device comprising the circuit (for example a television receiver) is turned on. It also is activated each time the receiver is tuned to a different channel or when the periodic processing in processor 25 of the averaged GCR signal detects a change in the channel characteristics. How often the configuration mode is activated is directly related to the speed at which the processor can determine the channel characteristics and calculate the necessary configuration data and coefficients. One advantage of the invention as embodied in filter circuit 200 is that it can respond very quickly to changes in the channel characteristics determined by the processor 25.

When the receiver is first turned on, the GCR signals carried on a number of fields of the the received signal are averaged and compared to a stored version of the transmitted GCR, by processor 25. The processor 25, using techniques known to those skilled in the art, processes and conditions the averaged GCR signal as required by the type of GCR signal being used. The channel characteristics are then determined using time domain analysis algorithms such as those described in the references incorporated herein, or others known in the art, in order to determine the location in time of the pre-echo components and post-echo components present in the received signal. This information determines the allocation of the filter sections in filter circuit 200 to FIR and IIR functions. The processor 25 also calculates the coefficients needed to create an ideal inverse channel characteristic.

Since the number of filter stages available in each filter section is limited, the processor must perform a clustering procedure which apportions the limited number of filter stages by effectively taking advantage of the tendency of the echo components to cluster in time. The procedure can use a preferred clustering algorithm such as the one described below. Other clustering algorithms which can also be used are known to those skilled in the art. The clustering algorithm creates a subset of the calculated coefficients and selects the necessary time delays, implemented in filter circuit 200, to select the filter stages 810 so as to coincide with the clustered echo components.

After the clustering procedure, a sequence of configuration data words including the necessary control words needed to set the FIR/IIR boundary, the scaling parameters (if use by the processor 25 in calculating the coefficients) and the delay parameters, are loaded into filter circuit 200 in order to configure it as required using the information provided in the Tables in conjunction with the example described above. The coefficients are then loaded into filter circuit 200 as follows:

1. A configuration data word is written into each of the section configuration registers 600 setting its Enable Cascade bit (see Table IV). All of the section configuration registers 600 are addressed by providing an address of fifteen on bits <7:4> of register 906 (see Table II). The contents of each section configuration register 600 thereby provides the set bit, i.e. bit eleven of control word e (see Table IV), as a "sum select" signal to multiplexer 805 to each filter stage 800 thereby connecting the "cas in or coef in" input to the "sum or coef in" input of the first filter tap 810 of each filter stage 800 so as to form a pipeline of all of the filter taps (i.e. 180 taps).

2. A configuration data word is written into the global configuration register 910 setting its Load Coefficient Mode bit (see Table III). The global configuration register is addressed by providing an address of fourteen on bits <7:4> of register 906 (see Table II). The contents of the global configuration register 910 thereby provides the md (coefficient mode) bit of control word h to each filter tap 810. As shown in FIG. 10, when set, the md bit selects the input provided to each multiplier 819. This selection is made in multiplexer 816 which has as one input the video samples provided by d during the filter mode and as another input, a stored zero value which is the input selected by the md bit in the configuration mode. The md bit is also coupled to multiplexer 818 which selects as a clock input to "sum" register 820, the clock signal from 158 during the filter mode and a "coef clk" signal during the configuration mode. The coef clk signal is used to toggle the coefficients into the pipelined filter stages as described below, and is derived by "ANDing" the STROBE signal provided to interface circuit 900 and a write signal to register 902 (which provides the coefficient data).

3. The coefficients are then sequentially written to register 902 and sequentially fed to the 180 pipelined filter taps 810. For example, a new coefficient is shifted into the filter taps 0 (i.e. tap 0 in filter section 0) when the coefficient register 902 is written to, and all other coefficients are shifted upward. The shifting of coefficients is accomplished by using register 820 in each filter tap which is clocked by the coef clk signal. After all of the coefficients are loaded, the holding register 815 of each filter tap 810 stores the coefficient to be loaded into the multiplier 819 of the respective filter stage. Note that the pipeline of 180 coefficient holding registers 815, needs no internal address select. Repeated writes to register 902 cause the data to move down the pipeline until all coefficients are initialized.

4. A configuration data word is written into the global configuration register 910 setting its Load Coefficient Strobe bit (see Table III). The global configuration register is addressed by providing an address of fourteen on bits <7:4> of register 906 (see Table II). The contents of the global configuration register 910 thereby provides the ld coef (coefficient strobe) bit of control word h to each filter tap 810. As shown in FIG. 10, the ld-coef bit when set, toggles register 815 and thereby provides the stored coefficient to the respective multiplier 819.

5. A configuration data word is written into the global configuration register 910 resetting the Load Coefficient Strobe bit.

6. A configuration data word is written into the global configuration register 910 resetting the Load Coefficient Mode bit.

7. All of the filter section configuration registers are again loaded with the configuration data to set them to the desired configuration and parameters, as described in step 1.

FIG. 11 describes the use of two filter circuits 301 and 302 (which are the same as filter circuit 200) connected in series ("cascaded") in order to create a larger filter circuit 300 with the resulting ability to provide a greater number of filter taps, i.e. 360 instead of 180 and the resulting expanded ability for IIR/FIR allocation and improved echo cancellation. The main circuit 301 of this multi-circuit embodiment has as its X<8:0> input the output from the A/D converter 10. The second circuit 302 has as its X<8:0> input, eight bits (Y<8:1>) of the filter output Y<8:0> and the single bit CASCADE X<0> output of the main circuit 301. The CASCADE-X<0> output is used to convey rounding information to the cascade chips of multi-circuit implementations.

The CASCADE X<0> output is provided by logic circuit 425 of final adder 400 of the main circuit 301. Circuit 425 has as inputs, the outputs of rounding circuits 409 and 421. The function of the logic circuit is to determine whether it is necessary to round out the data being transferred to the second circuit 302. This is done according to the following truth table where a 1 indicates that rounding occurred in the respective rounding circuit and a 0 indicates that no rounding was necessary.

| Rounding 409 | Circuit 421 | X<0> |
|---|---|---|
| 0 | 0 | 0 |
| 0 | 1 | 1 |
| 1 | 0 | 0 |
| 1 | 1 | 0 |

The CASCADE DATA <17:0> bidirectional port of second circuit 302 provides the feedback input to the CASCADE DATA <17:0> bidirectional port of main circuit 301 and the full nine bit Y<8:0> output of main circuit 301 provides the output of the multi-circuit filter circuit.

Clustering Algorithm

A N-taps full FIR filter has the following transfer function:

$$y(n) = \sum_{j=0}^{N-1} C_f(j)x(n-j).$$

As mentioned above, the circuit architecture of the invention can be more efficiently used by exploiting the fact that non-zero coefficients and thus multipliers are only required where there are echoes. This suggests a filter consisting of clusters of taps which can be randomly positioned relative to $C_f(0)$ ("tap zero"). That can be achieved by preceding each cluster of taps with a programmable delay line. The architecture of the invention described above provides the means for providing the necessary delay.

Given C clusters of M taps each (C and M being integers), the transfer function of a clustered FIR filter becomes $$y(n) = \sum_{p=1}^{C} \sum_{q=0}^{M-1} Cl_{cl}(p,q)x(n - \Delta_p - q) \qquad (1)$$

where $\Delta_p$ is the delay achieved by the p-th delay line and $C1_c(p,q)$ is the q-th coefficient in the p-th cluster. Alternatively (1) can be written as

```
( M is even )
BEGIN
    FOR j := 1 TO C DO                          { do for each cluster j (j = 1..C) }
    BEGIN
        i_peak := index( max{ |C_f[i]| } );     { find peak in C_f; i_peak is index of peak }
        Δ_j := i_peak - M/2;                    { center cluster j around peak }
        IF ( Δ_j < 0 ) THEN Δ_j = 0;            { if cluster j exceeds lower array boundary, put at boundary }
        IF ( Δ_j > N-M ) THEN Δj = N-M;         { if cluster j exceeds upper array boundary, put at boundary }
        C1_c[j,0..M-1] = C_f[Δ_j..Δ_j+M-1];     { copy coefficients from C_f to C1_c }
        C_f[Δ_j..Δ_j+M-1] = 0;                  { mark coefficients in C_f as used }
    END
END
```

$$y(n) = \sum_{j=0}^{N-1} C2_c(j)x(n-j) \quad (2)$$

where $$C2_c(j) = \sum_{p=1}^{C} \sum_{q=0}^{M-1} C1_c(p,q) \text{ with } \Delta_p + q = j \quad (3)$$

From (3), it follows that when there are no overlapping clusters (i.e. $|\Delta_a - \Delta_b| \geq M$, $\forall$ a,b), each coefficient $C2_c(j)$ corresponds to a single coefficient $C1_c(p,q)$. When there is overlap however, coefficient $C2_c(j)$ may be the sum of several coefficients $C1_c(p,q)$. Since the clustered filter will have fewer taps than the full filter (CM<N), it is an approximation of the latter. Finding the best approximation is an optimization problem which can be formalized as follows:

Given: $C_f[0 \ldots N-1]$ = coefficient for the full filter.
Wanted: $\Delta_1 \ldots C$ and $C1_c(1 \ldots C, 0 \ldots M-1)$ = delay values and coefficients for the clustered filter, such that $$E = \frac{1}{N} \sum_{j=0}^{N-1} e(C_f(j), C2_c(j)) \quad (4)$$

is minimum. Here, e(a,b) is some error function of a and b. For example, when $e = (a-b)^2$, (3) gives the Mean Square Error between $C_f$ and $C2_c$.

Solving (4) mathematically is rather difficult. It would require a substantial computation effort, which is not desired in a real time system. The invention provides a practical rather than a mathematical solution, which combines the benefits of simple computations and excellent performance. Solving (4) means finding the best location for each of the C available clusters. That translates into finding the best values of $\Delta_1 \ldots C$.

It can be shown that there are $$\begin{bmatrix} N - C(M - 1) \\ C \end{bmatrix} \quad (5)$$

ways to position C clusters of M taps over a total of N taps (N>CM). Since the desired cancellation range for video requires N to be rather large, the number of possible solutions is enormous. When for instance N=512, C=15, M=8, substitution in (5) shows there are $8*10^{26}$ different settings of $\Delta_1 \ldots 15$.

Below we describe a method for aproximating the optimum delay settings which can be implemented in processor 25, for example. It has shown to be fast and give good results. The method is described in simplified form by means of pseudo-programming language. Its basic operation is to locate the peaks in $C_f$ and then center the available clusters in $Cl_c$ around these peaks.

The foregoing disclosure and description of the invention is illustrative and explanatory thereof and various changes in the design and configuration, and the algorithms therewith, may be made within the scope of the appended claims without departing from the spirit of the invention.

I claim:

1. A digital signal processing apparatus suitable for use as a filter circuit in a device which, after receiving and deriving a plurality of signal samples from a signal transmitted over a transmission path, identifies and substantially removes path induced distortion to said signal, wherein said device comprises a processor for deriving a set of filter coefficients and set of configuration control signals related to distortion components of said path induced distortion, said apparatus comprising in combination:

a) first providing means coupled to said processor, for providing said control signals and said coefficients to said apparatus;
   b) second providing means coupled to receive said plurality of signal samples, for providing said signal samples to said apparatus and for providing processed samples from said apparatus, said second providing means comprising an unprocessed sample input, first and second processed sample inputs, and first and second sample outputs;
   c) a plurality of filter sections each comprising:
      i. means switchably coupled to said first and second sample outputs, for selecting as filter section input samples, one of said first and second sample outputs under the control of a second control signal;
      ii. delay means coupled to said selecting means, for providing a delay to said filter section input samples;
      iii. a filter stage comprising a plurality of taps, a first filter input coupled to said delay means for receiving said delayed filter section input samples, a first stage output, a second stage output switchably connected to said first processed sample input under the control of a first control signal, a third stage output switchably coupled to said second processed sample input under the control of a second control signal, and a second filter input switchably coupled to the first stage output of an adjacent filter stage; and
   d) means coupled to said second providing means, for configuring a first group of said filter sections into a first filter and a second group of said filter sections into a second filter.

2. The apparatus of claim 1, wherein said first filter is an FIR filter and said second filter is an IIR filter.

3. The apparatus of claim 1 wherein said configuring means comprises means for providing a programmable delay to the samples provided by said first and second processed sample outputs.

4. The apparatus of claim 1 wherein said second providing means comprises means for coupling said apparatus to a second said apparatus.

5. A digital signal processing apparatus suitable for use in an echo cancellation system in which a television signal comprising a ghost cancellation reference signal is transmitted over a transmission path having a distortion characteristic which adds at least one echo component to said signal, said digital signal processing apparatus comprising:

a) means for periodically analyzing said ghost cancellation reference signal and for calculating a plurality of filter coefficients defining the inverse distortion characteristic of said transmission path and a plurality of control signals related to said at least one echo component; and b) a plurality of filter sections coupled to said analysing means which are configured, in response to said control signals, into a first filter suitable for substantially cancelling a first type of echo component and a second filter suitable for substantially cancelling a second type of echo component.

6. The apparatus of claim 5, wherein said first filter is an FIR filter and said second filter is an IIR filter.

* * * * *